(12) United States Patent
Sasaki et al.

(10) Patent No.: US 12,468,220 B2
(45) Date of Patent: Nov. 11, 2025

(54) MASK BLANK SUBSTRATE, SUBSTRATE WITH MULTILAYER REFLECTIVE FILM, REFLECTIVE MASK BLANK, REFLECTIVE MASK, AND METHOD OF MANUFACTURING SEMICONDUCTOR DEVICE

(71) Applicant: HOYA CORPORATION, Tokyo (JP)

(72) Inventors: Tatsuya Sasaki, Tokyo (JP); Masaru Tanabe, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 531 days.

(21) Appl. No.: 17/972,887

(22) Filed: Oct. 25, 2022

(65) Prior Publication Data

US 2023/0132780 A1 May 4, 2023

(30) Foreign Application Priority Data

Oct. 29, 2021 (JP) ................................ 2021-177544

(51) Int. Cl.
*G03F 1/60* (2012.01)
*G03F 1/24* (2012.01)
*G03F 1/54* (2012.01)

(52) U.S. Cl.
CPC .................. *G03F 1/60* (2013.01); *G03F 1/24* (2013.01); *G03F 1/54* (2013.01)

(58) Field of Classification Search
CPC ........................................................ G03F 1/60
See application file for complete search history.

(56) References Cited

U.S. PATENT DOCUMENTS

| 2005/0245383 | A1* | 11/2005 | Iwahashi | C03C 3/06 501/54 |
| 2010/0035165 | A1* | 2/2010 | Hayashi | B82Y 10/00 430/5 |
| 2022/0308438 | A1* | 9/2022 | Iwamoto | G03F 1/60 |

FOREIGN PATENT DOCUMENTS

JP 5716730 B2 3/2015

* cited by examiner

*Primary Examiner* — Chanceity N Robinson
(74) *Attorney, Agent, or Firm* — Sughrue Mion, PLLC

(57) ABSTRACT

A mask blank substrate includes two opposing main surfaces, has a glass material containing $SiO_2$ and $TiO_2$, and has a first region in one main surface side. The first region is a region within a square including a center portion in the one main surface and which is a region extending from the one main surface toward the other main surface up to a position in depth. An inner region of the substrate excluding the first region has a locally non-uniform portion, a ratio of Ti content rate to Si content rate (Ti/Si) of the non-uniform portion differs from Ti/Si of the inner region excluding the non-uniform portion by 0.25% or more, and the variation of Ti content rate in the inner region of the substrate excluding the first region and the non-uniform portion is 0.06 mass % or less.

17 Claims, 5 Drawing Sheets

[FIG. 1]
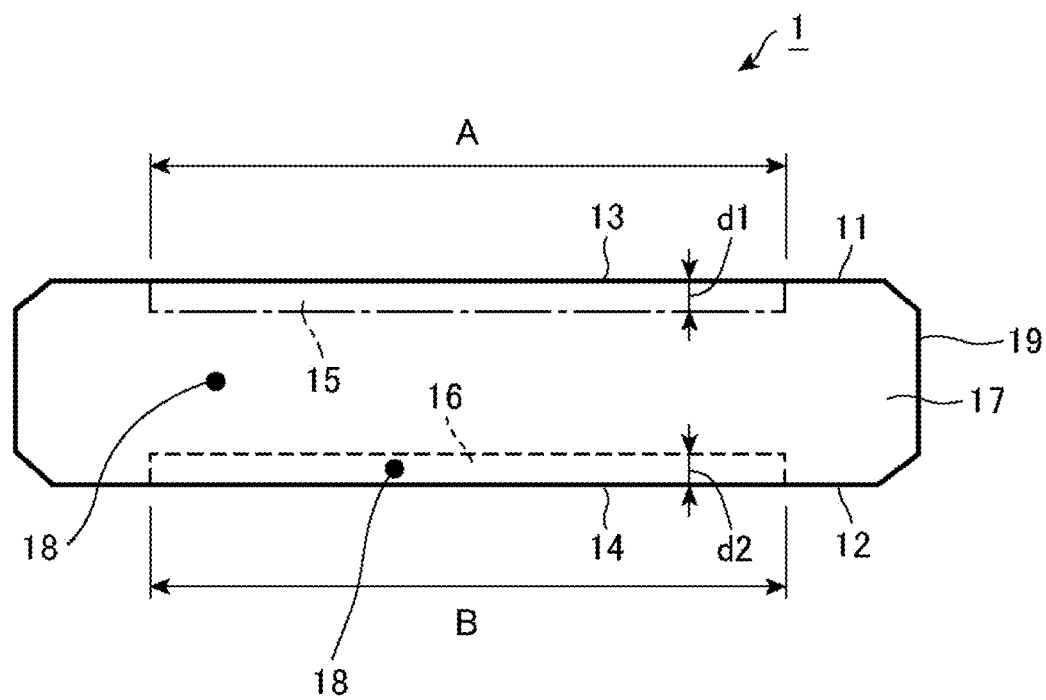

[FIG. 3]
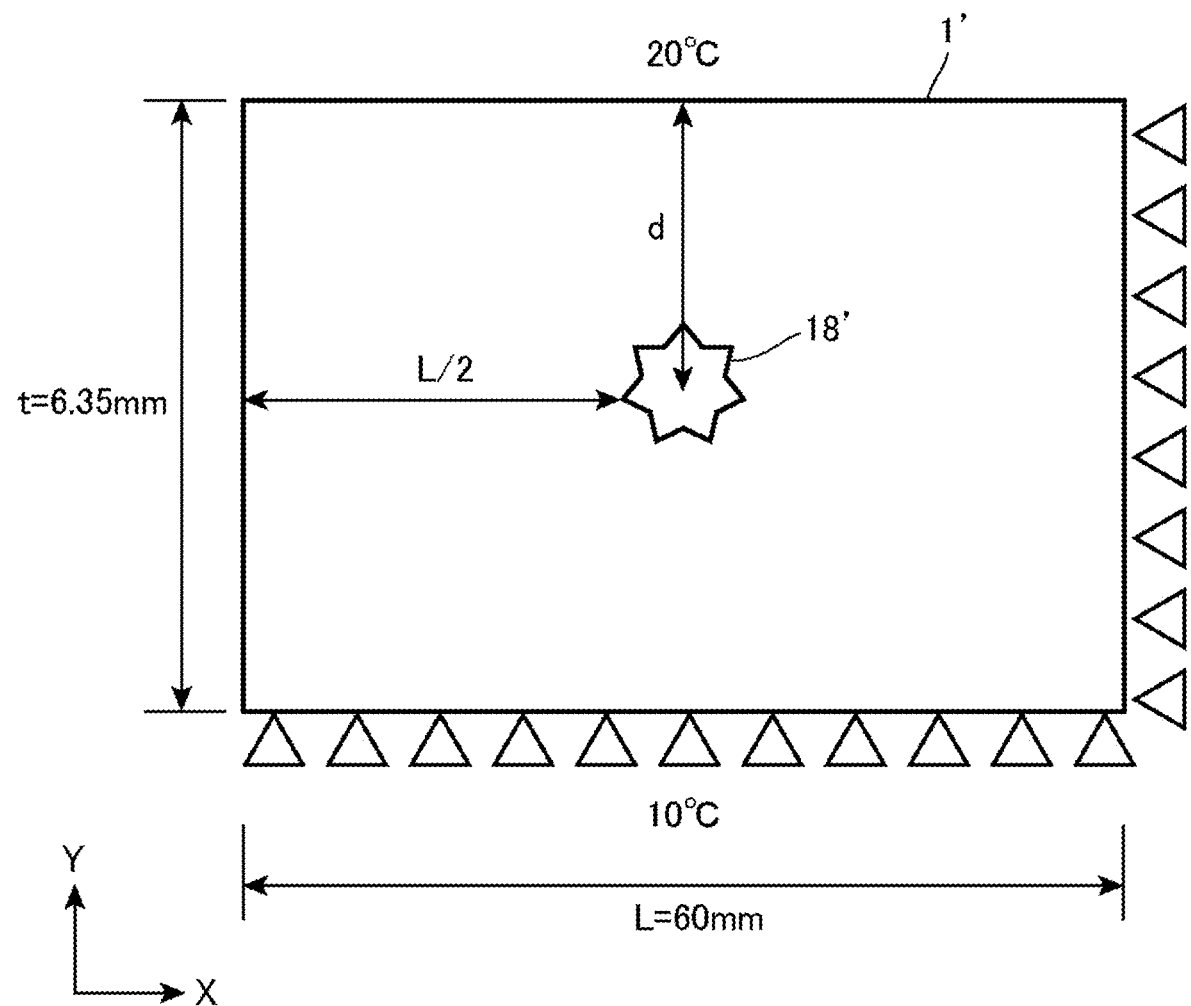

[FIG. 4]
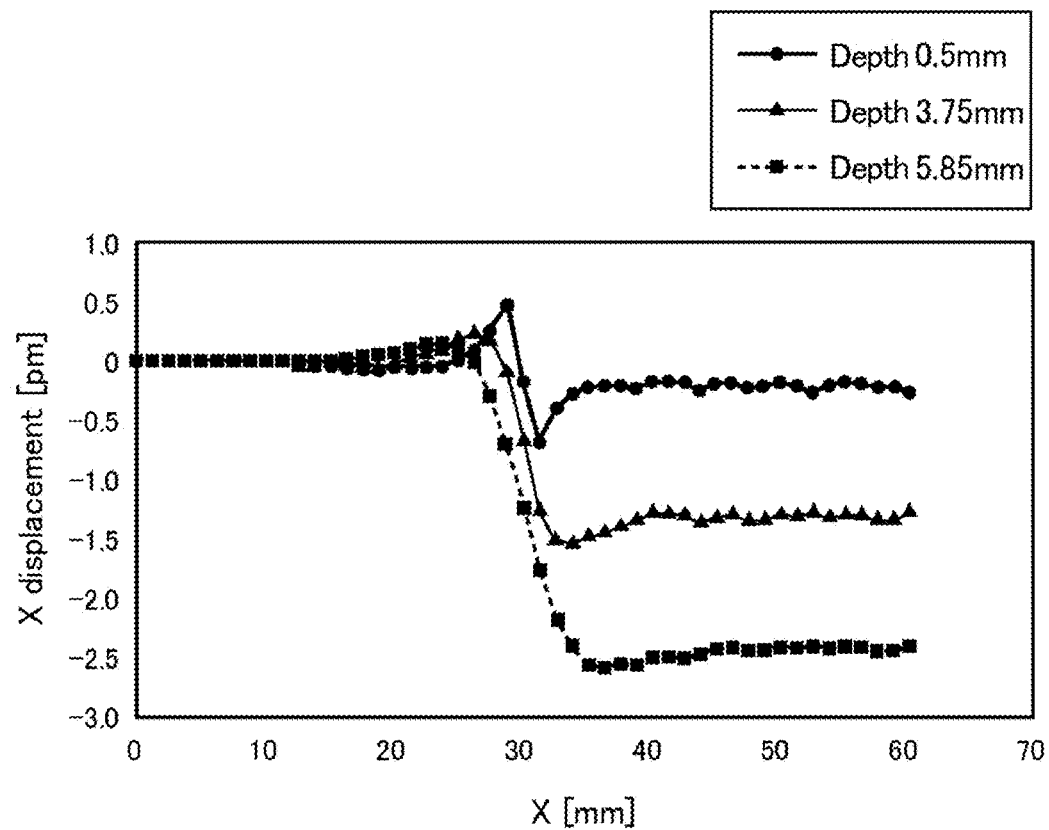
[FIG. 5]
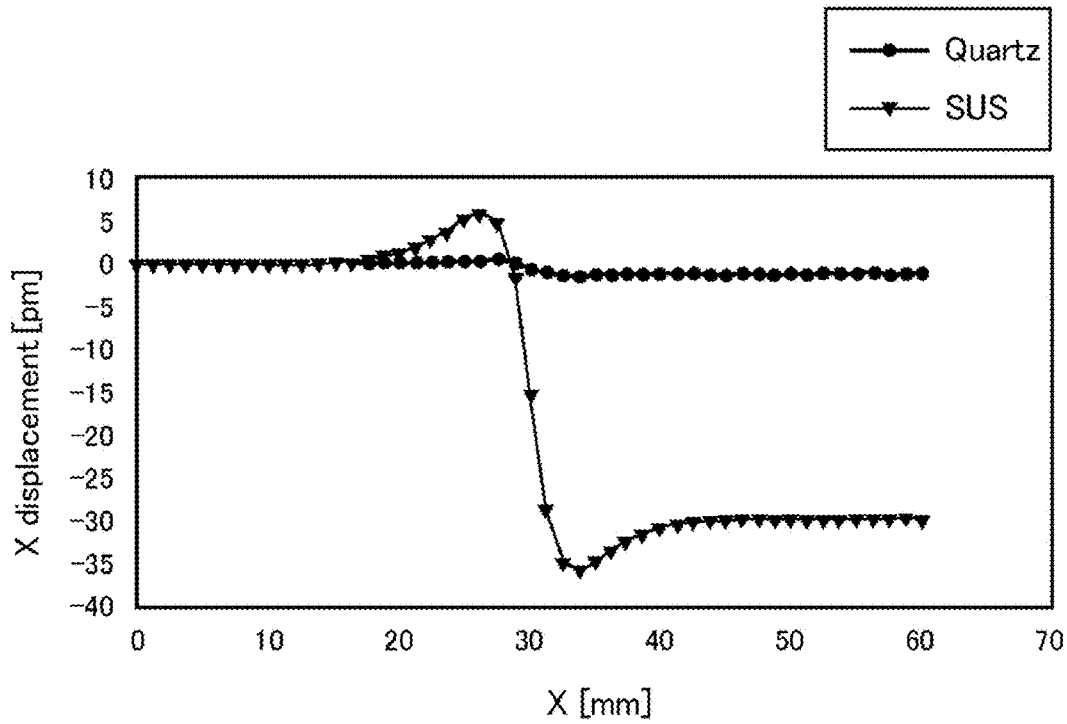

[FIG. 6]
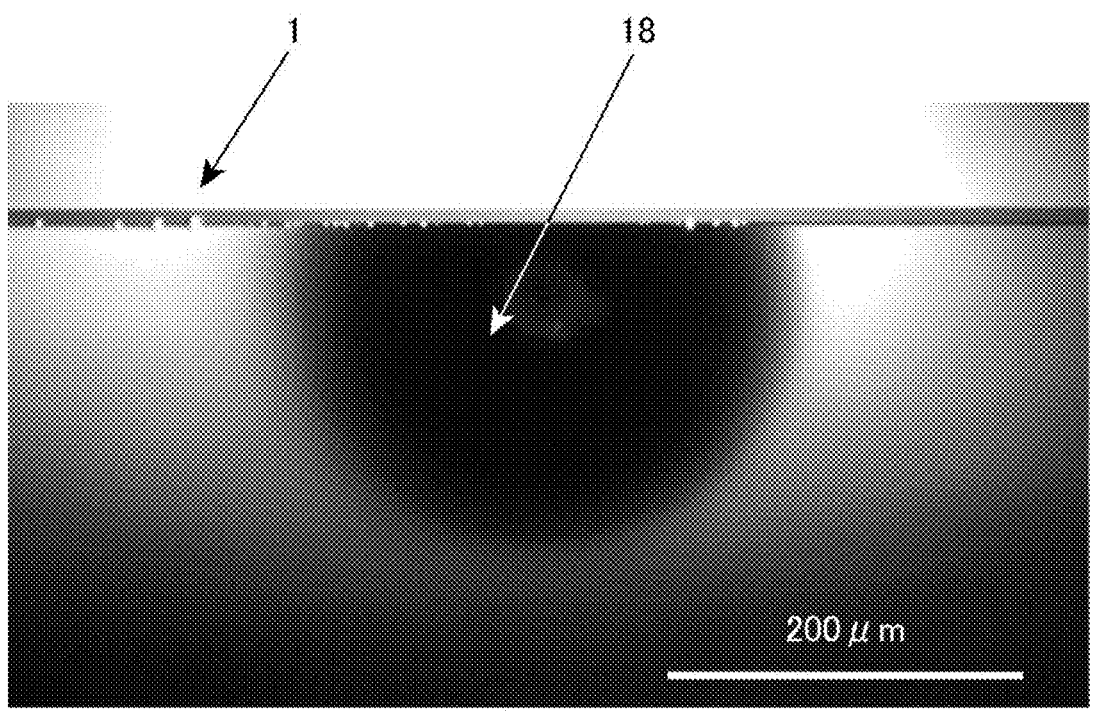

MASK BLANK SUBSTRATE, SUBSTRATE WITH MULTILAYER REFLECTIVE FILM, REFLECTIVE MASK BLANK, REFLECTIVE MASK, AND METHOD OF MANUFACTURING SEMICONDUCTOR DEVICE

CROSS-REFERENCE TO RELATED APPLICATIONS

This application claims priority to Japanese Patent Application No. 2021-177544, filed on Oct. 29, 2021, and the contents of which is incorporated by reference.

TECHNICAL FIELD

The present disclosure relates to a mask blank substrate suitably used for manufacturing an exposure mask used for manufacturing a semiconductor device, etc., a substrate with a multilayer reflective film, a reflective mask blank, a reflective mask, and a method of manufacturing a semiconductor device.

BACKGROUND ART

An exposure apparatus in manufacturing semiconductor devices has evolved by gradually shortening the wavelength of a light source. In order to realize finer pattern transfer, EUV lithography using an extreme ultraviolet ray (EUV: Extreme Ultra Violet; may hereafter be referred to as EUV light) having a wavelength around 13.5 nm has been developed. In EUV lithography, a reflective mask is used since there are not many materials that are transparent to EUV light.

For a substrate suitably used for a reflective mask for such EUV lithography and a reflective mask blank for manufacturing the same, a material of low thermal expansion is needed to avoid distortion under EUV light irradiation, and a low thermal expansion glass is being studied.

As a material for such substrates, Patent Document 1 describes a silica glass containing $TiO_2$ ($TiO_2$—$SiO_2$ glass), which is produced by flame hydrolysis of glass-forming materials, which is a silica glass with a $TiO_2$ concentration of 1 to 12 mass %, with the difference between the maximum and minimum $TiO_2$ concentrations of 0.06 mass % or less within a 30 mm×30 mm area in at least one plane.

PRIOR ART PUBLICATION

Patent Document

[Patent Document 1]
Japan Patent No. 5716730

SUMMARY OF THE DISCLOSURE

Problems to be Solved by the Disclosure

Generally, in manufacturing a glass material of a low thermal expansion glass, it is difficult to manufacture without portions therein where a composition (e.g., $TiO_2$ concentration) is locally non-uniform.

A shape of a mask blank substrate is cut from a glass material, main surfaces, etc. of the mask blank substrate are polished, and visual inspection is performed. By the visual inspection, substrates having portions where a composition is locally non-uniform are removed as rejected articles. However, since it is difficult to manufacture a glass material without portions where a composition is locally non-uniform as mentioned above, its low yield has been a problem.

Thus, it is an aspect of the present disclosure to provide a mask blank substrate that can satisfy the required characteristics as a mask blank substrate while having a non-uniform portion therein, and that can contribute to enhancement in production yield, a substrate with a multilayer reflective film, a reflective mask blank, a reflective mask, and a method of manufacturing a semiconductor device.

Means for Solving the Problem

To solve the above problem, the present disclosure includes the following configurations.

(Configuration 1)

A mask blank substrate including two opposing main surfaces,
  in which the substrate consists of a glass material containing $SiO_2$ and $TiO_2$,
  in which the substrate has a first region in one main surface side,
  in which the first region is a region within a 132 mm×104 mm square including a center portion in the one main surface and which is a region extending from the one main surface toward the other main surface up to a position of 500 μm in depth,
  in which an inner region of the substrate excluding the first region has a locally non-uniform portion,
  in which a ratio of Ti content rate to Si content rate (Ti/Si) of the non-uniform portion differs from Ti/Si of the inner region excluding the non-uniform portion by 0.25% or more, and
  in which a variation of Ti content rate in the inner region of the substrate excluding the first region and the non-uniform portion is 0.06 mass % or less.

(Configuration 2)

The mask blank substrate according to Configuration 1, in which the substrate has a second region in the other main surface side, and
  in which the second region is a region within a 132 mm×104 mm square including a center portion in the other main surface and which is a region extending from the other main surface toward the one main surface up to a position of 500 μm in depth, and
  in which the second region has the non-uniform portion therein.

(Configuration 3)

The mask blank substrate according to Configuration 1 or 2, in which Ti content rate of the substrate excluding the non-uniform portion is 3 mass % or more.

(Configuration 4)

The mask blank substrate according to any of Configurations 1 to 3, in which Ti/Si of the non-uniform portion is less than Ti/Si of the inner region excluding the non-uniform portion.

(Configuration 5)

A substrate with a multilayer reflective film including a substrate having two opposing main surfaces and a multilayer reflective film provided on one main surface of the substrate,
  in which the substrate consists of a glass material containing $SiO_2$ and $TiO_2$,
  in which the substrate has a first region on the one main surface side,
  in which the first region is a region within a 132 mm×104 mm square including a center portion in the one main surface and which is a region extending from the one main surface toward the other main surface up to a position of 500 µm in depth, in which an inner region of the substrate excluding the first region has a locally non-uniform portion, in which a ratio of Ti content rate to Si content rate (Ti/Si) of the non-uniform portion differs from Ti/Si of the inner region excluding the non-uniform portion by 0.25% or more, and in which a variation of Ti content rate in the inner region of the substrate excluding the first region and the non-uniform portion is 0.06 mass % or less.

(Configuration 6)

The substrate with a multilayer reflective film according to Configuration 5, in which the substrate has a second region in the other main surface side, in which the second region is a region within a 132 mm×104 mm square including a center portion in the other main surface and which is a region extending from the other main surface toward the one main surface up to a position of 500 µm in depth, and in which the second region has the non-uniform portion therein.

(Configuration 7)

The substrate with a multilayer reflective film according to Configuration 5 or 6, in which Ti content rate of the substrate excluding the non-uniform portion is 3 mass % or more.

(Configuration 8)

The substrate with a multilayer reflective film according to any of Configurations 5 to 7, in which Ti/Si of the non-uniform portion is less than Ti/Si of the inner region excluding the non-uniform portion.

(Configuration 9)

A reflective mask blank including a substrate having two opposing main surfaces, a multilayer reflective film provided on one main surface of the substrate, and a thin film for pattern formation provided on the multilayer reflective film, in which the substrate consists of a glass material containing $SiO_2$ and $TiO_2$, in which the substrate has a first region on the one main surface side, in which the first region is a region within a 132 mm×104 mm square including a center portion in the one main surface and which is a region extending from the one main surface toward the other main surface up to a position of 500 µm in depth, in which an inner region of the substrate excluding the first region has a locally non-uniform portion, in which a ratio of Ti content rate to Si content rate (Ti/Si) of the non-uniform portion differs from Ti/Si of the inner region excluding the non-uniform portion by 0.25% or more, and in which a variation of Ti content rate in the inner region of the substrate excluding the first region and the non-uniform portion is 0.06 mass % or less.

(Configuration 10)

The reflective mask blank according to Configuration 9, in which the substrate has a second region on the other main surface side, in which the second region is a region within a 132 mm×104 mm square including a center portion in the other main surface and which is a region extending from the other main surface toward the one main surface up to a position of 500 µm in depth, and in which the second region has the non-uniform portion therein.

(Configuration 11)

The reflective mask blank according to Configuration 9 or 10, in which Ti content rate of the substrate excluding the non-uniform portion is 3 mass % or more.

(Configuration 12)

The reflective mask blank according to any of Configurations 9 to 11, in which Ti/Si of the non-uniform portion is less than Ti/Si of the inner region excluding the non-uniform portion.

(Configuration 13)

A reflective mask including a substrate having two opposing main surfaces, a multilayer reflective film provided on one main surface of the substrate, and a thin film provided on the multilayer reflective film and having a transfer pattern, in which the substrate consists of a glass material containing $SiO_2$ and $TiO_2$, in which the substrate has a first region on the one main surface side, in which the first region is a region within a 132 mm×104 mm square including a center portion in the one main surface and which is a region extending from the one main surface toward the other main surface up to a position of 500 µm in depth, in which an inner region of the substrate excluding the first region has a locally non-uniform portion, in which a ratio of Ti content rate to Si content rate (Ti/Si) of the non-uniform portion differs from Ti/Si of the inner region excluding the non-uniform portion by 0.25% or more, and in which a variation of Ti content rate in the inner region of the substrate excluding the first region and the non-uniform portion is 0.06 mass % or less.

(Configuration 14)

The reflective mask according to Configuration 13, in which the substrate has a second region on the other main surface side, in which the second region is a region within a 132 mm×104 mm square including a center portion in the other main surface and which is a region extending from the other main surface toward the one main surface up to a position of 500 µm in depth, and in which the second region has the non-uniform portion therein.

(Configuration 15)

The reflective mask according to Configuration 13 or 14, in which Ti content rate of the substrate excluding the non-uniform portion is 3 mass % or more.

(Configuration 16)

The reflective mask according to any of Configurations 13 to 15, in which Ti/Si of the non-uniform portion is less than Ti/Si of the inner region excluding the non-uniform portion.

(Configuration 17)

A method of manufacturing a semiconductor device including transferring the transfer pattern to a resist film on a semiconductor substrate by exposure using the reflective mask according to any of Configurations 13 to 15.

Effect of the Disclosure

According to the present disclosure, it is possible to provide a mask blank substrate that can satisfy the required characteristics as a mask blank substrate while having a non-uniform portion therein, and that can contribute to enhancement in production yield, a substrate with a multilayer reflective film, a reflective mask blank, a reflective mask, and a method of manufacturing a semiconductor device.

BRIEF DESCRIPTION OF THE DRAWINGS

FIG. 1 is a schematic cross-sectional view of a principal portion of a mask blank substrate of an embodiment of the present disclosure.

FIG. 3 is an explanatory view of a model substrate used in a finite element method.

FIG. 4 is a graph showing the relationship between the lateral position of a model non-uniform portion (X position) and the displacement at an upper end of the model substrate at the X position at each predetermined depth in a model substrate.

FIG. 5 is a graph showing the relationship between the lateral position of a model non-uniform portion (X position) and the displacement at an upper end of the model substrate at the X position for each material.

FIG. 6 is a photograph of a non-uniform portion in a substrate.

EMBODIMENTS FOR CARRYING OUT THE DISCLOSURE

Figure 2A:
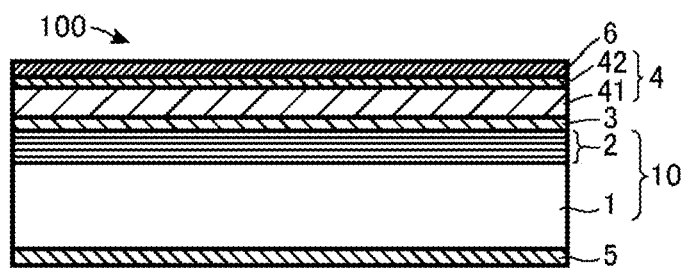
FIGS. 2A-2F are schematic cross-sectional views of a principal portion of a mask blank substrate, a multilayer reflective film substrate, and a reflective mask blank of an embodiment of the present disclosure, showing the steps of manufacturing a reflective mask from a reflective mask blank in a schematic cross-sectional view of a principal portion.

The embodiment of the present disclosure is explained below. First, the background of the present disclosure is explained.

For example, in the case of a synthetic quartz glass substrate used for an ArF transfer mask, presence of a local compositional non-uniform portion therein causes attenuation in the light amount when exposure light upon exposure transfer transmits through the compositional non-uniform portion. Therefore, in the case of the synthetic quartz glass substrate, the presence of the local compositional non-uniform portion therein is unacceptable.

In contrast, in the case of a low thermal expansion glass substrate used for an EUV reflective mask, the reflective mask does not transmit EUV exposure light in the low thermal expansion glass substrate. From this viewpoint, there is no problem even if a local compositional non-uniform portion exists inside the low thermal expansion glass substrate.

However, in the case of an EUV reflective mask, the coefficient of thermal expansion of a substrate used for the reflective mask should be extremely small. The reason is that when EUV light is irradiated onto the reflective mask, EUV light being irradiated and absorbed by a substrate and a multilayer reflective film generates heat, and thermal expansion of the substrate causes movement of the position of a transfer pattern (absorber pattern) on the multilayer reflective film, and it is necessary to restrain the movement. The influence of position displacement of the absorber pattern on the multilayer reflective film caused by the presence of a local compositional non-uniform portion in a low thermal expansion glass substrate was verified by a simulation using the finite element method.

This point is explained together with FIG. 3. FIG. 3 is an explanatory view of a model substrate used in the finite element method. As shown in FIG. 3, a model substrate 1' (hereafter simply referred to as "substrate 1'") has a thickness t of 6.35 mm and a length L in lateral direction (X direction) of 60 mm. The size of the substrate 1' assumes about half of a substrate in the effective range of a 6025 size mask. For this substrate 1', a situation was assumed where a right end in X-direction and a bottom end in Y-direction were constrained, respectively. Next, considering the exposure conditions, the upper end temperature of the substrate 1' was set to 20° C., and the lower end temperature to 10° C. The size of a model non-uniform portion 18' (hereafter simply referred to as "non-uniform portion 18'") in the substrate 1' was set to 50 μm wide×50 μm high, and linear CTE (coefficient of thermal expansion) of the non-uniform portion 18' was set to $6.5 \times 10^{-7}$/° C. (equivalent to synthetic quartz glass, i.e., equivalent to the part with high $SiO_2$ concentration). The linear coefficient of thermal expansion CTE of the substrate 1' was based on the catalog of the low thermal expansion glass of Corning Inc. (ULE® 7973 Low Expansion Glass). Under these conditions, the depth d and lateral X position of the non-uniform portion 18' were set (in FIG. 3, depth d=t/2, lateral X position=L/2), and the X displacement of the upper end of the substrate 1' (corresponding to the displacement of the pattern upon exposure) was analyzed by the finite element method. The X displacement of the upper end of the substrate 1' was analyzed for those where values of depth d and lateral X position of the non-uniform portion 18' were changed. The results of the analysis are explained together with FIGS. 4 and 5.

FIG. 4 is a graph showing the relationship between the lateral position of a model non-uniform portion (X position) and the displacement at the upper end of a model substrate at the X position at each predetermined depth in the model substrate. The substrate 1' in FIG. 4 has a non-uniform portion 18' positioned in any one of a depth of 0.5 mm, a depth of 3.75 mm, and a depth of 5.85 mm from the upper end of the substrate 1'. In FIG. 4, the lateral position (X position) of the non-uniform portion 18' is shown on the horizontal axis, and the displacement at the upper end of the substrate 1' at the X position of the non-uniform portion 18' (X displacement) is shown on the vertical axis. As shown in FIG. 4, the value of the X displacement was found to be on the order of pm, which is an extremely small value.

FIG. 5 is a graph showing the relationship between the lateral position of a model non-uniform portion (X position) and the displacement at the upper end of a model substrate at the X position for each material in the model substrate. The non-uniform portion 18' in the substrate 1' in FIG. 5 is assumed as equivalent to a synthetic quartz glass (equivalent to portion having high $SiO_2$ concentration (Si content rate)) and equivalent to SUS (stainless steel) (equivalent to portion having high $TiO_2$ concentration (Ti content rate)). The size of the non-uniform portion 18' was set to 50 μm wide×50 μm high and the depth d of 0.5 mm, similar to FIG. 4. In FIG. 5 as well, the lateral position of the non-uniform portion 18' (X position) is shown on the horizontal axis, and the displacement at the upper end of the substrate 1' at the X position (X displacement) is shown on the vertical axis. As shown in the FIG. 5, the value of the X displacement was also found to be on the order of pm, which is an extremely small value.

As understood from these analysis results, the influence of the presence of a local compositional non-uniform portion inside the substrate on the position displacement of the absorber pattern was found to be negligible.

On the other hand, it was found that when a local compositional non-uniform portion exists in the vicinity of a main surface of a substrate (preferably in a region at the depth within 500 μm or less), relatively small convex and concave defects are likely to occur on the main surface. It was also found that the cause of the occurrence of these convex and concave defects is the presence of a compositional non-uniform portion. When a compositional non-uniform portion with low $TiO_2$ concentration (Ti content rate) (i.e., high $SiO_2$ concentration (Si content rate)) exists in the vicinity of the main surface of the substrate, the polishing rate tends to be slower in the compositional non-uniform portion than in other areas when polishing the main surface of the substrate, and the difference in polishing rate is assumed as causing convex defects on the main surface of the substrate after polishing. Further, when a compositional non-uniform portion with high $TiO_2$ concentration (Ti content rate) (i.e., low $SiO_2$ concentration (Si content rate)) exists in the vicinity of the main surface of the substrate, the difference in resistance to cleaning solutions such as hydrofluoric acid is likely to occur when cleaning the main surface of the substrate, and it is presumed that the compositional non-uniform portion is preferentially dissolved and concave defects are generated.

Furthermore, since the presence of these concave or convex defects on a main surface of a substrate on the side where a multilayer reflective film is formed causes great adverse effect on the formation of the multilayer reflective film, it is desirable that these concave or convex defects do not exist. On the other hand, the presence of these concave or convex defects on a main surface of a substrate on the side where a conductive film to be electrostatically chucked is formed causes little influence on the formation of the conductive film.

Based on the results of these intensive studies, the inventors have come to the conclusion that although the presence of a local compositional non-uniform portion in the vicinity of a main surface of a substrate on the side where a multilayer reflective film is formed is unacceptable, characteristics that are sufficient as a substrate for a reflective mask blank can be obtained even if the presence of a local compositional non-uniform portion in other inner regions of the substrate is accepted.

With visual inspection of a substrate and conventional inspection devices, the presence of a compositional non-uniform portion in the substrate can be distinguished; however, the depth of which the compositional non-uniform portion exists from a main surface of a substrate cannot be distinguished. The inventors of the present application studied this problem intensively. The inventors focused on the fact that a low thermal expansion glass substrate generally contains $TiO_2$ and therefore emits fluorescence when irradiated with DUV light, and that fluorescence is emitted in the entire region of a main surface of a substrate irradiated with DUV light. If there is a portion with locally low $TiO_2$ concentration (Ti content rate) in the vicinity of a main surface of a substrate, only such portion emits low or no fluorescence. Conversely, if there is a portion with locally high $TiO_2$ concentration (Ti content rate) in the vicinity of a main surface of a substrate, only such portion emits high fluorescence. Further, DUV light irradiated on a main surface of a substrate is converted into fluorescence at a surface layer of the substrate (near the main surface) by $TiO_2$ (Ti) and hardly reaches the interior of the substrate. This point is explained together with FIG. 6. FIG. 6 is a photograph of a non-uniform portion in the vicinity of a main surface of a substrate. This photograph shows a cross-section of the substrate when irradiated with DUV light at a wavelength of 266 nm. As shown in FIG. 6, the presence of a dark-colored non-uniform portion 18 was confirmed in the vicinity of the main surface (near the surface layer) of the substrate 1. While FIG. 6 shows the non-uniform portion in the area with low $TiO_2$ concentration (Ti content rate), the non-uniform portion can similarly be confirmed in the area with high $TiO_2$ concentration (Ti content rate) (non-uniform portion in this case appears brighter relative to surrounding areas near the main surface of the substrate).

From the results of these intensive studies, the inventors concluded that by irradiating DUV light on a main surface of a substrate, the presence of a non-uniform portion with low or high $TiO_2$ concentration (Ti content rate) in a surface layer (near the main surface) of the substrate can be distinguished.

The present disclosure was made as a result of the diligent studies described above.

The embodiment of the present disclosure is described specifically below together with the drawings. Incidentally, the embodiment given below is one of the embodiments upon embodying the present disclosure and is not intended to limit the disclosure within such a scope. Same reference numerals are applied to identical or equivalent portions in the drawings of which descriptions may be simplified or omitted.

<Mask Blank Substrate 1>

A mask blank substrate 1 (may simply be referred to as substrate 1) is a rectangular plate-like body having two opposing main surfaces 11, 12 and an end surface 19. The two opposing main surfaces 11, 12 are the upper and lower surfaces of the plate-like body and are formed to face each other. At least one of the two opposing main surfaces 11, 12 is the main surface 11 on which a multilayer reflective film or a thin film for pattern formation is to be formed (may be referred to one main surface). The main surface 12 opposite to the main surface 11 on which a multilayer reflective film or a thin film for pattern formation is to be formed may be referred to as a back surface (or the other main surface).

The substrate 1 preferably has a coefficient of low thermal expansion within the range of 0±5 ppb/° C. in order to prevent position displacement of an absorber pattern 4a (FIGS. 2A-2F) due to heat during exposure by EUV light to the substrate 1 or a multilayer reflective film 2. Examples of materials having the coefficient of low thermal expansion within the above range that can be used include $SiO_2$—$TiO_2$-based glass, $SiO_2$—$TiO_2$-based glass containing halogen (fluorine (F), chlorine (C)), $SiO_2$—$TiO_2$ glass containing oxides other than $TiO_2$ (e.g., $B_2O_3$, $P_2O_5$, etc.), and so forth.

As for the mask blank substrate 1, 6025 size (152.4 mm×152.4 mm×6.35 mm) is preferably used. The substrate 1 has a first region 15 in the one main surface 11 side.

The first region 15 is a region inside a square A of 132 mm×104 mm (pattern formation region) 13 including a center portion in the one main surface 11 (region of the main surface 11 excluding the region outside the square A) and which is a region extending from the one main surface 11 toward the other main surface 12 up to a position of the depth d1 of 500 μm. The depth d1 is more preferably 250 μm.

The mask blank substrate 1 has a local non-uniform portion 18 in the inner region 17 excluding the first region 15. The ratio of Ti content rate to Si content rate (Ti/Si) of the non-uniform portion 18 differs from Ti/Si of the inner region 17 excluding the non-uniform portion 18 by 0.25% or more. This difference is calculated by subtracting the smaller value from the larger value.

The variation of Ti content rate in the inner region 17 excluding the first region 15 and the non-uniform portion 18 is 0.06 mass % or less. The content rate variation of 0.06 mass % or less can be regarded as substantially uniform, and the desired thermal expansion properties can be ensured.

As described above, the influence on the position displacement of an absorber pattern caused by the non-uniform portion 18 in the inner region 17 excluding the first region 15 can be regarded as negligible. Namely, the mask blank substrate 1 having the above configuration can satisfy the required properties as the mask blank substrate 1 while having the non-uniform portion 18 inside, and can contribute to enhancing production yield.

In particular, the mask blank substrate 1 having the above configuration can ensure desired thermal expansion properties even when the output of an exposure light source is increased (e.g., 500 W or more) in the future.

The composition of the non-uniform portion 18 is not particularly limited as long as the composition meets the above requirements. Namely, the portion can have low $TiO_2$ concentration (Ti content rate), high $TiO_2$ concentration (Ti content rate), and furthermore, other elements (Al, Cr, Fe, etc.) may be contained.

The mask blank substrate 1 has a second region 16 in the other main surface 12 side. The second region 16 is a region inside a square B of 132 mm×104 mm (pattern formation region) 14 positioned in a center portion in the other main surface 12 (region of the main surface 12 excluding the region outside the square B) and which is a region extending from the other main surface 12 toward the one main surface 11 up to a position of the depth d2 of 500 μm. The depth d2 is more preferably 250 μm.

The mask blank substrate 1 can have the non-uniform portion 18 in the second region 16.

As mentioned above, the presence of concave or convex defects on the main surface 12 of the substrate 1 on the side where a conductive film 5 (see FIGS. 2A-2F) to be electrostatically chucked is formed causes little influence on the formation of the conductive film 5. Namely, the mask blank substrate 1 having the above configuration can also satisfy the required properties as the mask blank substrate 1, and can further contribute to enhancing production yield.

In this embodiment, while the regions of squares A and B were set to 132 mm×104 mm considering the region where a minimum pattern is formed, it is not limited thereto, and can be set to, for example, 132 mm×132 mm.

The Ti content rate of the substrate 1 excluding the non-uniform portion 18 is preferably 3 mass % or more from the viewpoint of thermal expansion properties. The Ti content rate of the substrate 1 excluding the non-uniform portion 18 is preferably 10 mass % or less. This is because the coefficient of thermal expansion may turn to negative when the rate exceeds 10 mass %. The Ti content rate is more preferably 5 to 9 mass %.

Although not particularly limited, the substrate 1 in this embodiment can be selected in the following manner.

First, the substrate 1 is prepared, which is cut from a glass material into a predetermined size and shape-processed, and thereafter, on the substrate having at least the main surfaces 11, 12 subjected to predetermined polishing, a substrate defect inspection apparatus, etc. of the inspection wavelength of 300 nm~500 nm is used to detect the presence/absence of the non-uniform portion in the inner region. With the inspection wavelength in this range, the presence/absence of the non-uniform portion over the entire substrate can be detected.

Next, the substrate in which the non-uniform portion is detected is irradiated with DUV light of the inspection wavelength of 300 nm or less (e.g., 266 nm) to respective main surfaces of the substrate, and cross-sectional images are acquired, respectively. By using DUV light with the inspection wavelength of 300 nm or less, it is possible to inspect a depth of 500 μm from the main surface.

The fluorescence emission intensity from the acquired cross-sectional images is compared to determine the presence/absence of the non-uniform portion, and the substrate determined as having no non-uniform portion in the first region can be selected as the mask blank substrate 1. The detection of the presence/absence of the non-uniform portion in the interior as described above may be performed by visual inspection.

Further, the size of the non-uniform portion 18 that is unacceptable in the first region 15 is preferably 50 μm or more, and more preferably 75 μm or more. This size can be detected by an inspection using DUV light described above. This is because if the size is less than the above, the influence on thermal expansion properties is significantly reduced.

Ti/Si of the non-uniform portion 18 can be less than Ti/Si of the inner region excluding the non-uniform portion 18. In this case, $SiO_2$ concentration (Si content) in the non-uniform portion is high, and as shown in FIG. 6, the presence of a dark non-uniform portion 18 can be observed in the vicinity of the main surface of the substrate 1 (near the surface layer).

The main surface 11 of the substrate 1 on the side where a multilayer reflective film 2 and a thin film for pattern formation 4 are formed is surface-processed to have a high flatness at least from the viewpoint of obtaining pattern transfer precision and position precision. In the case of an EUV exposure, in a region of 132 mm×132 mm in the center portion of the main surface 11 of the substrate 1 on the side where the multilayer reflective film 2 or the thin film for pattern formation 4 is formed, the flatness is preferably 0.1 μm or less, more preferably 0.05 μm or less, and particularly preferably 0.03 μm or less. On the main surface 12 opposite to the side where the transfer pattern is formed and which is subjected to an electrostatic chuck when set on an exposure apparatus, in a region of 132 mm×132 mm in the center portion of the main surface 12, the flatness is preferably 0.1 μm or less, more preferably 0.05 μm or less, and particularly preferably 0.03 μm or less. The flatness of the main surface 12 of the reflective mask blank 100 in a region of 142 mm×142 mm in the center portion of the main surface 12 is preferably 1 μm or less, more preferably 0.5 μm or less, and particularly preferably 0.3 μm or less.

A high surface smoothness of the substrate 1 is also a very important factor. A surface roughness of the main surface 11 of the substrate 1 in which an absorber pattern 4a is formed is preferably a root mean square roughness (RMS) of 0.1 nm or less. The surface smoothness can be measured by an atomic force microscope.

Further, the substrate 1 preferably has high rigidity in order to restrain deformation of a film (such as multilayer reflective film 2) formed thereon due to film stress. In particular, the substrate 1 preferably has a high Young's modulus of 65 GPa or more.

<Substrate with Multilayer Reflective Film>

Next, a multilayer reflective film-substrate 10 in the embodiment of the present disclosure is explained. The multilayer reflective film-substrate 10 includes a substrate 1 having two opposing main surfaces 11, 12 and a multilayer reflective film 2 provided on the one main surface 11 of the substrate 1. The substrate 1 has the same configuration as the mask blank substrate 1 described above.

In this specification, the term "including a multilayer reflective film 2 on the main surface of the substrate 1" means that the multilayer reflective film 2 is disposed in contact with the surface of the substrate 1, and also includes the case where another film is provided between the substrate 1 and the multilayer reflective film 2. The same applies to other films. For example, "having a film B on a film A" means that the film A and the film B are disposed in direct contact with each other, and also includes the case of having another film provided between film A and film B. Further, in this specification, for example, "film A is disposed in contact with a surface of film B" means that films A and B are disposed in direct contact with each other without an interposing film therebetween.

«Multilayer Reflective Film 2»

The multilayer reflective film 2 provides a reflective mask 200 with a function to reflect EUV light, and is a multilayer film in which each layer containing elements having different refractive indices as main components is stacked in cycles.

Generally, a multilayer film in which a thin film of a non-heavy element or a compound thereof as a high refractive index material (high refractive index layer) and a thin film of a heavy element or a compound thereof as a low refractive index material (low refractive index layer) are alternately stacked for about 40 to 60 cycles is used as the multilayer reflective film 2. The multilayer film can be formed by stacking a plurality of cycles, where one cycle consists of a stacked structure of high refractive index layer/low refractive index layer stacked in the order of the high refractive index layer and the low refractive index layer from the substrate 1 side. Further, the multilayer film can be formed by stacking a plurality of cycles, where one cycle consists of a stacked structure of low refractive index layer/high refractive index layer stacked in the order of the low refractive index layer and the high refractive index layer from the substrate 1 side. An uppermost layer of the multilayer reflective film 2, namely, the surface layer of the multilayer reflective film 2 on the side opposite to the substrate 1, is preferably the high refractive index layer. In the case of forming the aforementioned multilayer film by stacking a plurality of cycles, where one cycle consists of a stacked structure of high refractive index layer/low refractive index layer stacked in the order of the high refractive index layer and the low refractive index layer from the substrate 1, the uppermost layer is the low refractive index layer. In this case, the low refractive index layer configuring the uppermost surface of the multilayer reflective film 2 facilitates oxidization and causes reduction in reflectance of the reflective mask 200. Therefore, it is preferable to further form a high refractive index layer on the uppermost low refractive index layer to form the multilayer reflective film 2. On the other hand, in the case of forming the aforementioned multilayer film by stacking a plurality of cycles, where one cycle consists of a stacked structure of low refractive index layer/high refractive index layer stacked in the order of the low refractive index layer and the high refractive index layer from the substrate 1 side, the high refractive index layer is disposed as the uppermost layer and therefore may be left as it is.

In this embodiment, a layer containing silicon (Si) is employed as the high refractive index layer. The Si-containing material can contain Si alone, and can also be a Si compound containing Si and boron (B), carbon (C), nitrogen (N), and oxygen (O). As the low refractive index layer, a single metal selected from molybdenum (Mo), ruthenium (Ru), rhodium (Rh), and platinum (Pt) or an alloy thereof is used. For example, as the multilayer reflective film 2 to EUV light having a wavelength of 13 nm to 14 nm, a Mo/Si cyclic stacked film in which Mo and Si films are alternately stacked for about 40 to 60 cycles is preferably used. The high refractive index layer, which is the uppermost layer of the multilayer reflective film 2, may be formed of silicon (Si).

A reflectance of the multilayer reflective film 2 alone is usually 65% or more, and the upper limit is usually 73%. The film thickness and cycle of each constituent layer of the multilayer reflective film 2 may be properly selected according to the exposure wavelength, and are selected to satisfy Bragg's law of reflection. Although there are a plurality of high refractive index layers and a plurality of low refractive index layers in the multilayer reflective film 2, the film thicknesses of the high refractive index layers with one another and the low refractive index layers with one another may not be the same. The film thickness of the Si layer on the uppermost surface of the multilayer reflective film 2 can be adjusted so as not to reduce the reflectance. The film thickness of the Si layer of the uppermost surface (high refractive index layer) can be in the range from 3 nm to 10 nm.

A method of forming the multilayer reflective film 2 is known in this technical field. For example, by ion beam sputtering method, each layer of the multilayer reflective film 2 can be formed. In the case of the Mo/Si cyclic multilayer film described above, first, a Si film having a thickness of about 4 nm is formed on the substrate 1 by ion beam sputtering method using a Si target for example. Thereafter, a Mo film having a thickness of about 3 nm is formed by using a Mo target. With this Si film/Mo film as one cycle, the cycles are stacked for 40 to 60 cycles to form the multilayer reflective film 2 (Si layer for the uppermost surface layer). When the multilayer reflective film 2 has for example sixty cycles, a reflectance to EUV light can be enhanced while the number of steps is increased compared to forty cycles.

<Configuration of Reflective Mask Blank 100 and Method of Manufacturing the Same>

FIG. 2A is a schematic cross-sectional view of a principal portion for explaining the configuration of a reflective mask blank 100 according to this embodiment. As shown in FIG. 2A, the reflective mask blank 100 includes a substrate 1, a multilayer reflective film 2, a protective film 3, and an absorber film (thin film for pattern formation) 4, which are stacked in this order. The multilayer reflective film 2 is formed at a main surface 11 side and reflects EUV light as exposure light with a high reflectance. The substrate 1 and the multilayer reflective film 2 have the same configuration as those of the multilayer reflective film-substrate 10 described above. The protective film 3 is provided to protect the multilayer reflective film 2, and is made of a material having resistance to etchant and cleaning liquid used in patterning the absorber film 4 to be mentioned below. The absorber film 4 absorbs EUV light. A conductive film 5 for an electrostatic chuck is formed at a main surface 12 side of the substrate 1.

As shown in FIG. 2A, the reflective mask blank 100 further has an etching mask film 6 on the absorber film 4.

This embodiment is explained below for each layer. The substrate 1 and the multilayer reflective film 2 have the configurations similar to the above, and explanation thereof is omitted.

«Protective Film 3»

The reflective mask blank 100 of this embodiment preferably has a protective film 3 between the multilayer reflective film 2 and the absorber film 4.

The protective film 3 can be formed on the multilayer reflective film 2 or in contact with a surface of the multilayer reflective film 2 to protect the multilayer reflective film 2 from dry etching and cleaning in the manufacturing process of the reflective mask 200 to be described later. The protective film 3 also serves to protect the multilayer reflective film 2 upon black defect repair of an absorber pattern 4a using an electron beam (EB). Although FIGS. 2A-2F show the case where the protective film 3 has one layer, the protective film 3 can have a stacked structure of two or more layers. The protective film 3 is formed of a material having resistance to etchant and cleaning liquid used in patterning the absorber film 4. By the protective film 3 being formed on the multilayer reflective film 2, it is possible to restrain damage on a surface of the multilayer reflective film 2 upon manufacturing a reflective mask 200 (EUV mask) using the substrate 1 having the multilayer reflective film 2 and the protective film 3. Therefore, an excellent reflectance property of the multilayer reflective film 2 to EUV light can be achieved.

In the reflective mask blank 100 of this embodiment, a material having durability to etching gas used in dry etching for patterning the absorber film 4 formed on the protective film 3 can be selected as the material of the protective film 3.

If the layer of the absorber film 4 in contact with the surface of the protective film 3 is, for example, a thin film consisting of a material containing ruthenium (Ru) (Ru-based material) such as the lower layer 41 of this embodiment, the material of the protective film 3 can be selected from silicon-based materials such as silicon (Si), a material containing silicon (Si) and oxygen (O), a material containing silicon (Si) and nitrogen (N), and a material containing silicon (Si), oxygen (O), and nitrogen (N).

The film thickness of the protective film 3 is not particularly limited as long as the function to protect the multilayer reflective film 2 can be exhibited. From the viewpoint of the reflectance of EUV light, the film thickness of the protective film 3 is preferably 1.0 nm or more and 8.0 nm or less, more preferably 1.5 nm or more and 6.0 nm or less.

As a method of forming the protective film 3, a method similar to a known film forming method can be employed without any particular limitation. Specific examples include sputtering method and ion beam sputtering method.

«Absorber Film (Thin Film for Pattern Formation) 4»

In the reflective mask blank 100 of this embodiment, an absorber film 4 for reducing the reflectance of EUV light is formed on the multilayer reflective film 2 or on the protective film 3 formed on the multilayer reflective film 2. As shown in FIGS. 2A-2F, the absorber film 4 of the reflective mask blank 100 of this embodiment includes a lower layer 41 and an uppermost layer 42.

In the reflective mask blank 100 of this embodiment, EUV light is absorbed and attenuated while a part of the light is reflected at a level that does not adversely affect pattern transfer in the area where the absorber film 4 (absorber pattern 4a) is provided. On the other hand, in an opening portion (area without the absorber film 4), EUV light is reflected from the multilayer reflective film 2 (from the multilayer reflective film through the protective film 3, if provided). The reflected light from the area where the absorber film 4 is formed has a desired reflectance difference from the reflected light from the opening portion. The reflected light from the area where the absorber film 4 is formed can have a desired phase difference from the reflected light from the opening portion. In allowing the reflected light from the area where the absorber film 4 is formed to have a phase difference from the reflected light from the opening portion, the absorber film 4 is formed to have the phase difference of 130 degrees to 230 degrees. An image contrast of a projected optical image is improved by lights with an inverted phase difference around 180 degrees or around 220 degrees interfering with each other at a pattern edge. This improvement of image contrast leads to an increase in resolution, and increases various tolerances related to exposure, such as exposure amount tolerance and focus tolerance.

Although it depends on the pattern and exposure conditions, to obtain the phase shift effect, a relative reflectance of the absorber pattern 4a to EUV light is preferably 2% to 40%, more preferably 6 to 35%, further preferably 15% to 35%, and even more preferably 15% to 25%. A relative reflectance of the absorber film 4 (absorber pattern 4a) refers to a reflectance of EUV light reflected from the absorber pattern 4a when EUV light reflected from the multilayer reflective film 2 (including multilayer reflective film 2 with protective film 3) in a portion without the absorber pattern 4a has a reflectance of 100%. In this specification, the relative reflectance may be simply referred to as "reflectance".

Although it depends on the pattern and exposure conditions, to obtain the phase shift effect, an absolute reflectance of the absorber film 4 (or absorber pattern 4a) to EUV light is preferably 4% to 27%, and more preferably 10% to 17%.

The absorber film 4 preferably includes a lower layer 41 and an uppermost layer 42. The uppermost layer 42 is the layer that is located on the topmost surface opposite to the multilayer reflective film 2, in the absorber film 4. The lower layer 41 is the layer located in any position in the absorber film 4 between the uppermost layer 42 and the multilayer reflective film 2. From the viewpoint of simplifying the film forming process, it is preferable that the absorber film 4 consists of two layers, the lower layer 41 and the uppermost layer 42. The lower layer 41 is preferably made of ruthenium (Ru) alone or a material containing ruthenium (Ru).

The absorber film 4 preferably includes the uppermost layer 42 formed of a material containing ruthenium (Ru) from the viewpoint of increasing verticality of the pattern sidewall shape. The same etching gas can be used in patterning the absorber film 4 by dry etching. The uppermost layer 42 preferably contains oxygen. By including oxygen in a Ru-based compound, the crystalline structure can be more amorphous. The uppermost layer 42 can include metal elements other than ruthenium (Ru). These metal elements include chromium (Cr) and iridium (Ir), and chromium (Cr) is particularly preferable from the viewpoint of etching rate and crystallinity.

The phase difference and reflectance of the absorber film 4 can be adjusted by changing the refractive index n, extinction coefficient k, and film thickness. The film thickness of the absorber film 4 is preferably 60 nm or less, more preferably 50 nm or less, and even more preferably 45 nm or less. The film thickness of the absorber film 4 is preferably 25 nm or more. In the case of having the protective film 3, the phase difference and reflectance of the absorber film 4 can be adjusted considering the refractive index n, extinction coefficient k, and film thickness of the protective film 3.

The thin film (e.g., lower layer 41 and uppermost layer 42) configuring the absorber film 4 of the predetermined materials described above can be formed by known methods, such as sputtering methods including DC sputtering method and RF sputtering method, and reactive sputtering method using oxygen gas or the like. An alloy target of Ru and Cr can be used as the target. The thin film forming the absorber film 4 can be formed by co-sputtering using a Ru target and a Cr target.

The absorber film 4 can be a multilayer film further including layers other than the lower layer 41 and the uppermost layer 42. For example, the absorber film 4 can further include a layer between the lower layer 41 and the protective film 3 to enhance etching selectivity with the protective film 3. The absorber film 4 can further include a layer between the uppermost layer 42 and the lower layer 41 to enhance optical characteristics. From the viewpoint of productivity, it is preferable that there are not too many layers in the absorber film 4. Therefore, it is preferable that the absorber film 4 of this embodiment consists of two layers, the lower layer 41 and the uppermost layer 42. However, the absorber film 4 of the present disclosure only needs to include at least the lower layer 41, and may be configured as a single layer structure using the material that constitutes the lower layer 41 described above.

«Etching Mask Film 6»

An etching mask film 6 can be formed on the absorber film 4 or in contact with a surface of the absorber film 4. As a material of the etching mask film 6, a material having high etching selectivity ratio of the absorber film 4 to the etching mask film 6 is used. "Etching selectivity ratio of B to A" herein refers to the ratio of etching rate between A, a layer that does not need to be etched (mask layer), and B, a layer that needs to be etched. Specifically, the ratio is defined by the formula "etching selectivity ratio of B to A=etching rate of B/etching rate of A". Further, "high selectivity ratio" means that the value of the above-defined selectivity ratio is greater than the target to be compared. An etching selectivity ratio of the absorber film 4 to the etching mask film 6 is preferably 1.5 or more and further preferably 3 or more.

The absorber film 4 formed of a Ru-based material of this embodiment can be etched by dry etching using chlorine-based gas containing oxygen, or oxygen gas. As a material with high etching selectivity ratio of the absorber film 4 of a Ru-based material to the etching mask film 6, a material of silicon (Si) or a silicon compound can be used.

Examples of silicon compounds that can be used in the etching mask film 6 include materials containing silicon (Si) and at least one element selected from nitrogen (N), oxygen (O), carbon (C), and hydrogen (H), and materials such as metal silicon (metal silicide) or metal silicon compound (metal silicide compound) containing metal in silicon or silicon compound. A metal silicon compound can include a material containing a metal and Si, and at least one element selected from N, O, C, and H.

The film thickness of the etching mask film 6 is preferably 2 nm or more from the viewpoint of obtaining a function as an etching mask for precisely forming a transfer pattern in the absorber film 4. The film thickness of the etching mask film 6 is preferably 15 nm or less from the viewpoint of reducing the film thickness of a resist film 8.

«Conductive Film 5»

A conductive film 5 for an electrostatic chuck is generally formed at the main surface 12 side of the substrate 1 (opposite to the surface on which the multilayer reflective film 2 is formed). Electrical characteristic (sheet resistance) required for the conductive film 5 for an electrostatic chuck is usually 100Ω/□ (Ω/Square) or less. The conductive film 5 can be formed by, for example, magnetron sputtering method or ion beam sputtering method, using a metal and alloy target of chromium (Cr), tantalum (Ta), etc.

The material containing chromium (Cr) of the conductive film 5 is preferably a Cr compound containing Cr and further containing at least one element selected from boron (B), nitrogen (N), oxygen (O), and carbon (C).

As the material containing tantalum (Ta) of the conductive film 5, it is preferable to use Ta (tantalum), an alloy containing Ta, or a Ta compound containing any of the above and at least one of boron, nitrogen, oxygen, and carbon.

The thickness of the conductive film 5 is not particularly limited as long as the function as an electrostatic chuck is satisfied. The thickness of the conductive film 5 is generally from 10 nm to 200 nm. The conductive film 5 also adjusts the stress of the main surface 12 side of the mask blank 100. Therefore, the conductive film 5 is adjusted so as to obtain a flat reflective mask blank 100 in balance with stresses from various films formed at the main surface 11 side.

<Reflective Mask 200 and Its Manufacturing Method>

This embodiment is a reflective mask 200 including a multilayer reflective film 2 and an absorber film 4 with a transfer pattern formed therein in this order on a main surface of a substrate 1. The substrate 1, the multilayer reflective film 2, the protective film 3, and the conductive film 5 of the reflective mask 200 have the configurations similar to those of the reflective mask blank 100 described above, respectively. By patterning the absorber film 4 of the reflective mask blank 100 of this embodiment, an absorber pattern 4a (transfer pattern) can be formed. The patterning of the absorber film 4 can be done by predetermined dry etching gas. The absorber pattern 4a of the reflective mask 200 absorbs EUV light, and some EUV light can be reflected with predetermined reflectance and phase difference to an opening portion (portion without absorber pattern 4a). The predetermined dry etching gas can be mixture gas of chlorine-based gas and oxygen gas, oxygen gas, etc. To pattern the absorber film 4, an etching mask film 6 can be provided on the absorber film 4 if necessary. In such a case, an etching mask pattern 6a can be used as a mask to dry-etch the absorber film 4 to form the absorber pattern 4a.

Explanation is made using FIGS. 2A-2F on a method of manufacturing a reflective mask 200 using the reflective mask blank 100 of this embodiment.

Figure 2B:
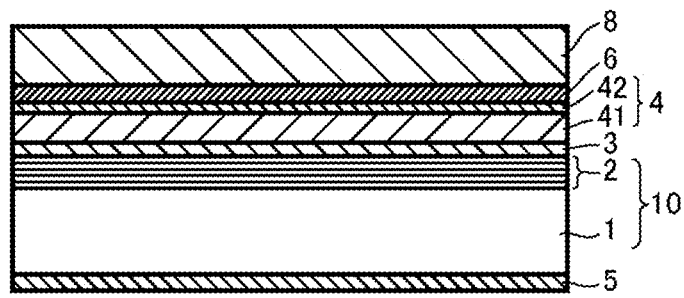
Figure 2C:
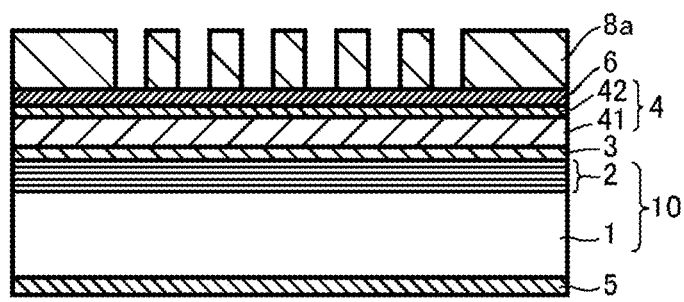

FIGS. 2A-2F are schematic cross-sectional views of a principal portion showing the step of manufacturing a reflective mask 200 from the reflective mask blank 100. The reflective mask blank 100 is prepared as shown in FIG. 2A. As shown in FIG. 2B, a resist film 8 is formed on an etching mask film 6 of a main surface 11 thereof (not necessary if resist film 8 is provided as reflective mask blank 100). As shown in FIG. 2C, a desired pattern is written (exposed) in the resist film 8, and further developed and rinsed to form a predetermined resist pattern 8a.

Figure 2D:
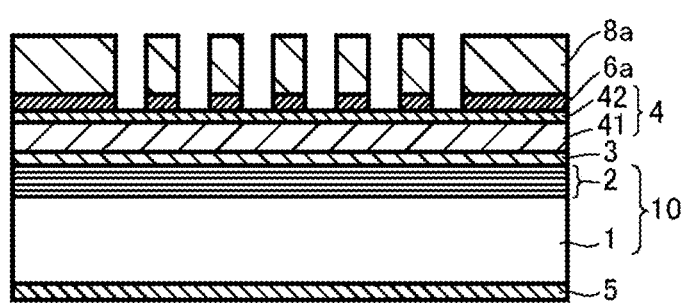
Figure 2E:
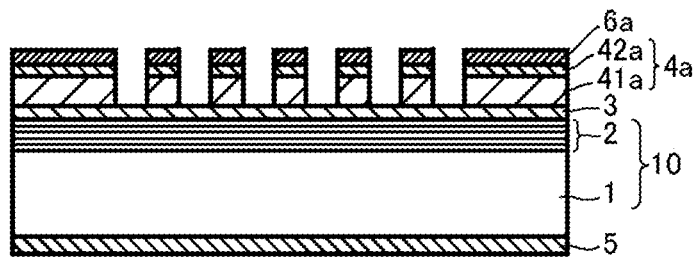
Figure 2F:
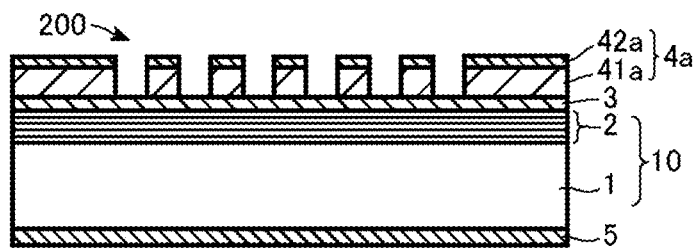

Next, as shown in FIG. 2D, the etching mask film 6 is etched with the resist pattern 8a as a mask to form an etching mask pattern 6a. Thereafter, the resist pattern 8a is removed by asking or by resist peeling liquid. With the etching mask pattern 6a as a mask, the absorber film 4 is etched to form an absorber pattern 4a as shown in FIG. 2E. Next, by removing the etching mask pattern 6a, the absorber pattern 4a is formed as shown in FIG. 2F. Finally, wet cleaning using an acidic or alkaline aqueous solution is performed to manufacture the reflective mask 200. A mask defect can be inspected after the wet cleaning if necessary, and a mask defect repair can be performed properly.

By the above process, the reflective mask 200 with a highly precise, fine absorber pattern 4a can be obtained.

<Method of Manufacturing Semiconductor Device>

This embodiment is a method of manufacturing a semiconductor device including the use of the aforementioned reflective mask 200. The semiconductor device can be manufactured by setting the reflective mask 200 of this embodiment on an exposure apparatus having an exposure light source of EUV light, and transferring by exposure a transfer pattern onto a resist film formed on a semiconductor substrate as a substrate of an object to be transferred.

Specifically, by performing an EUV exposure using the reflective mask 200 of this embodiment, a desired transfer pattern based on an absorber pattern 4a of the reflective mask 200 can be formed on the semiconductor substrate. In addition to the lithography step, a semiconductor device having a desired electronic circuit formed thereon can be manufactured by performing various steps such as etching of a film to be processed, formation of an insulating film and a conductive film, introduction of a dopant, and annealing.

EXAMPLES

The examples are described below together with the drawings. This embodiment is not limited to these examples. In the examples, an identical reference numeral is applied to similar components and explanation thereof is omitted or simplified.

Example 1

As Example 1, a $SiO_2$—$TiO_2$-based glass substrate as a low thermal expansion glass substrate of 6025 size (about 152 mm×152 mm×6.35 mm) having both of a first main surface and a second main surface polished was prepared as a substrate 1. To obtain flat, smooth main surfaces, polishing steps including a rough polishing process, a precision polishing process, a local process, and a touch polishing process were performed.

The substrate 1 was selected using the following process. First, the presence/absence of a non-uniform portion 18 over the entire substrate 1 was detected by a substrate defect inspection apparatus using an inspection light (laser light) with an inspection wavelength of 300 nm to 500 nm. As a result, the presence of the non-uniform portion 18 was confirmed in an inner region 17 of the substrate 1.

The substrate 1 was then irradiated with DUV light of an inspection wavelength of 266 nm on the main surfaces 11, 12, respectively, using an inspection apparatus manufactured by Olympus Corporation, and respective cross-sectional images were obtained.

The fluorescence emission intensity from the acquired cross-sectional images was compared to determine the presence/absence of the non-uniform portion. In the cross-sectional image including a first region 15, there was no local dark or white area, and the brightness was uniform in the entirety. In other words, no non-uniform portion with a size of 50 μm or greater was detected in the first region 15.

On the other hand, in the cross-sectional image including a second region 16, a local dark area, compared to the surrounding area, of 50 μm in size was detected. Thus, the substrate 1 of Example 1 had the non-uniform portion 18 in the inner region 17 of the substrate 1 excluding the first region 15. Further, the second region 16 also had the non-uniform portion 18. The size of the non-uniform portion 18 in the inner region 17 was 50 μm, and the size of the non-uniform portion 18 in the second region 16 was 200 μm.

Further, the ratio of Ti content rate to Si content rate (Ti/Si) of the non-uniform portion 18 was 11.25%, and Ti/Si of the inner region 17 excluding the non-uniform portion 18 was 10.75%. Accordingly, Ti/Si of the non-uniform portion 18 differed from Ti/Si of the inner region 17 excluding the non-uniform portion 18 by 0.5%, which was 0.25% or more.

The Ti/Si values given above were calculated by analyzing the elements (C, O, Al, Si, Ti) contained in the substrate 1 by energy dispersive X-ray spectroscopy (EDX) from the main surface 12 of the substrate toward the inner region 17 for every 3 μm in a region of approximately 300 μm in depth, and thereafter Ti/Si of the non-uniform portion 18 and Ti/Si of the inner region 17 were calculated with Ti/Si as a moving average value of ten sections (points). Ti/Si of the non-uniform portion 18 was set as the maximum value of Ti/Si, and Ti/Si of the inner region 17 was set as the average value of 30 points of the moving average values in the inner region 17 excluding the non-uniform portion 18. Ti/Si was calculated in same way for Comparative Example 1 below.

In the substrate 1 of Example 1, the variation of Ti content rate in the inner region 17 excluding the first region 15 and the non-uniform portion 18 was 0.04 mass %, which was 0.06 mass % or less.

Ti content rate of the substrate 1 excluding the non-uniform portion 18 was 4 mass %, which was 3 mass % or more. Further, Ti/Si of the non-uniform portion 18 was less than Ti/Si of the inner region 17 excluding the non-uniform portion 18.

Using the substrate of Example 1, a reflective mask blank 100 having the structure shown in FIG. 2A was manufactured as follows.

First, a conductive film 5 consisting of a CrN film was formed on a main surface 12 of the substrate 1 by magnetron sputtering (reactive sputtering) method under the following conditions. The conductive film 5 was formed with the film thickness of 20 nm using a Cr target under a mixed gas atmosphere of argon (Ar) gas and nitrogen ($N_2$) gas.

Next, a multilayer reflective film 2 was formed on a main surface 11 of the substrate 1 that is opposite to the side on which the conductive film 5 was formed. The multilayer reflective film 2 formed on the substrate 1 was formed as a cyclic multilayer reflective film consisting of molybdenum (Mo) and silicon (Si) so that the multilayer reflective film 2 is suitable for EUV light of 13.5 nm wavelength. The multilayer reflective film 2 was formed by alternately stacking a Mo layer and a Si layer on the substrate 1 using a Mo target and a Si target by ion beam sputtering method in krypton (Kr) gas atmosphere. First, a Si film was formed with the film thickness of 4.2 nm and a Mo film with the film thickness of 2.8 nm. With the above as one cycle, forty cycles were stacked similarly, and finally a Si film was formed with the film thickness of 4.0 nm and the multilayer reflective film 2 was formed.

Next, a protective film 3 consisting of an $SiO_2$ film was formed with the thickness of 2.6 nm on a surface of the multilayer reflective film 2 in an Ar gas atmosphere using a $SiO_2$ target by RF sputtering method.

Next, a thin film consisting of ruthenium (Ru), chromium (Cr), nitrogen (N), and oxygen (O) (RuCrNO film) was formed as a lower layer 41 of an absorber film 4 of Example 1 by DC magnetron sputtering method. The lower layer 41 was formed with the film thickness of 33.5 nm using a Ru target and a Cr target, under a mixed gas atmosphere of krypton (Kr) gas, nitrogen ($N_2$) gas, and oxygen gas ($O_2$). The gas flow ratio during film formation was Kr:$N_2$:$O_2$=12:

8:1. The film was formed by applying a 1500 W power supply to the Ru target and a 500 W power supply to the Cr target, respectively.

Next, a thin film consisting of ruthenium (Ru), chromium (Cr), and oxygen (O) (RuCrO film) was formed as an uppermost layer 42 of the absorber film 4 by DC magnetron sputtering method (reactive sputtering method). The uppermost layer 42 was formed with the film thickness of 8.5 nm using a Ru target and a Cr target under a mixed gas atmosphere of krypton (Kr) gas and oxygen ($O_2$) gas by reactive sputtering.

Next, an etching mask film 6 consisting of a $Si_3N_4$ film was formed on the absorber film 4. The $Si_3N_4$ film was formed with the film thickness of 20 nm using a Si target in a nitrogen gas atmosphere by reactive sputtering method. By the above procedure, the reflective mask blank 100 of Example 1 was manufactured.

Next, a reflective mask 200 of Example 1 was manufactured using the reflective mask blank 100 as shown in FIGS. 2A-2F.

The reflective mask 200 manufactured in Example 1 was set on an EUV scanner, and an EUV exposure was made on a wafer having a film to be processed and a resist film formed on a semiconductor substrate. By developing the exposed resist film, a resist pattern was formed on the semiconductor substrate having a film to be processed formed thereon. A semiconductor device having desired characteristics was manufactured by transferring the resist pattern on the film to be processed by etching, and through various steps such as formation of an insulating film and a conductive film, introduction of a dopant, and annealing.

Thus, the substrate 1 of Example 1 satisfied the required properties as a mask blank substrate while having a non-uniform portion inside. Using the substrate 1 of Example 1 as a mask blank substrate can contribute to enhancing production yield.

Comparative Example 1

As Comparative Example 1, a $SiO_2$—$TiO_2$-based glass substrate as a low thermal expansion glass substrate of 6025 size (about 152 mm×152 mm×6.35 mm) having both of a first main surface and a second main surface polished was prepared as a substrate 1, similar to Example 1. To obtain flat, smooth main surfaces, polishing steps including a rough polishing process, a precision polishing process, a local process, and a touch polishing process were performed.

The inspection similar to that of Example 1 was made on the substrate 1, and the presence of a non-uniform portion 18 was confirmed not only in an inner region 17 and a second region 16 of the substrate 1 but also in a first region 15. The size of the non-uniform portion 18 confirmed in the first region 15 was 150 μm.

Ti/Si of the non-uniform portion 18 of the inner region 17 was 11.25%, and Ti/Si of the inner region 17 excluding the non-uniform portion 18 was 10.75%. Accordingly, Ti/Si of the non-uniform portion 18 differed from Ti/Si of the inner region 17 excluding the non-uniform portion 18 by 0.5%, which was 0.25% or more.

In the substrate 1 of Comparative Example 1, the variation of Ti content rate in the first region 15 excluding the non-uniform portion 18 and the inner region excluding the non-uniform portion 18 was 0.04 mass %, which was 0.06 mass % or less.

Ti content rate of the substrate 1 excluding the non-uniform portion 18 was 4 mass %, which was 3 mass % or more. Further, Ti/Si of the non-uniform portion 18 was less than Ti/Si of the inner region 17 excluding the non-uniform portion 18.

Using the substrate of Comparative Example 1, a reflective mask blank 100 having the structure shown in FIG. 2A was manufactured in the manner similar to that of Example 1.

Next, a reflective mask 200 of Comparative Example 1 was manufactured using the reflective mask blank 100 as shown in FIGS. 2A-2F.

The reflective mask 200 manufactured in Comparative Example 1 was set on an EUV scanner, and an EUV exposure was made on a wafer having a film to be processed and a resist film formed on a semiconductor substrate. By developing the exposed resist film, a resist pattern was formed on the semiconductor substrate having the film to be processed thereon. The resist pattern was inspected, and an occurrence of an unacceptable position displacement with respect to a desired position was found. This position displacement is considered as caused by thermal expansion of the substrate 1 in the reflective mask 200 of Comparative Example 1.

Unlike the case of Example 1, in the case where the reflective mask 200 of Comparative Example 1 was used, a semiconductor device having desired characteristics could not be manufactured.

DESCRIPTION OF REFERENCE NUMERALS 1. substrate (mask blank substrate)
1'. model substrate
2. multilayer reflective film
3. protective film
4. absorber film (thin film for pattern formation)
4a. absorber pattern (thin film having transfer pattern formed)
5. conductive film
6. etching mask film
6a. etching mask pattern
8. resist film
8a. resist pattern
10. multilayer reflective film-substrate
11. main surface (one main surface)
12. main surface (other main surface)
13. pattern forming region
14. pattern forming region
15. first region
16. second region
17. inner region
18. non-uniform portion
18'. model substrate
19. end surface
41. lower layer
41a. lower layer pattern
42. uppermost layer
42a. uppermost layer pattern
100. reflective mask blank
200. reflective mask
A. Square showing the dimension of first region
B. Square showing the dimension of second region

The invention claimed is:

1. A mask blank substrate comprising two opposing main surfaces,
wherein the substrate consists of a glass material containing $SiO_2$ and $TiO_2$,
wherein the substrate has a first region in one main surface side, wherein the first region is a region within a 132 mm×104 mm square comprising a center portion in the one main surface and which is a region extending from the one main surface toward the other main surface up to a position of 500 µm in depth, wherein an inner region of the substrate excluding the first region has a locally non-uniform portion, wherein a ratio of Ti content rate to Si content rate (Ti/Si) of the non-uniform portion differs from Ti/Si of the inner region excluding the non-uniform portion by 0.25% or more, and wherein a variation of Ti content rate in the inner region of the substrate excluding the first region and the non-uniform portion is 0.06 mass % or less.

2. The mask blank substrate according to claim 1, wherein the substrate has a second region in the other main surface side, and wherein the second region is a region within a 132 mm×104 mm square comprising a center portion in the other main surface and which is a region extending from the other main surface toward the one main surface up to a position of 500 µm in depth, and wherein the second region has the non-uniform portion therein.

3. The mask blank substrate according to claim 1, wherein Ti content rate of the substrate excluding the non-uniform portion is 3 mass % or more.

4. The mask blank substrate according to claim 1, wherein Ti/Si of the non-uniform portion is less than Ti/Si of the inner region excluding the non-uniform portion.

5. A substrate with a multilayer reflective film comprising a substrate having two opposing main surfaces and a multilayer reflective film provided on one main surface of the substrate, wherein the substrate consists of a glass material containing $SiO_2$ and $TiO_2$, wherein the substrate has a first region on the one main surface side, wherein the first region is a region within a 132 mm×104 mm square comprising a center portion in the one main surface and which is a region extending from the one main surface toward the other main surface up to a position of 500 µm in depth, wherein an inner region of the substrate excluding the first region has a locally non-uniform portion, wherein a ratio of Ti content rate to Si content rate (Ti/Si) of the non-uniform portion differs from Ti/Si of the inner region excluding the non-uniform portion by 0.25% or more, and wherein a variation of Ti content rate in the inner region of the substrate excluding the first region and the non-uniform portion is 0.06 mass % or less.

6. The substrate with a multilayer reflective film according to claim 5, wherein the substrate has a second region in the other main surface side, wherein the second region is a region within a 132 mm×104 mm square comprising a center portion in the other main surface and which is a region extending from the other main surface toward the one main surface up to a position of 500 µm in depth, and wherein the second region has the non-uniform portion therein.

7. The substrate with a multilayer reflective film according to claim 5, wherein Ti content rate of the substrate excluding the non-uniform portion is 3 mass % or more.

8. The substrate with a multilayer reflective film according to claim 5, wherein Ti/Si of the non-uniform portion is less than Ti/Si of the inner region excluding the non-uniform portion.

9. A reflective mask blank comprising a substrate having two opposing main surfaces, a multilayer reflective film provided on one main surface of the substrate, and a thin film for pattern formation provided on the multilayer reflective film, wherein the substrate consists of a glass material containing $SiO_2$ and $TiO_2$, wherein the substrate has a first region on the one main surface side, wherein the first region is a region within a 132 mm×104 mm square comprising a center portion in the one main surface and which is a region extending from the one main surface toward the other main surface up to a position of 500 µm in depth, wherein an inner region of the substrate excluding the first region has a locally non-uniform portion, wherein a ratio of Ti content rate to Si content rate (Ti/Si) of the non-uniform portion differs from Ti/Si of the inner region excluding the non-uniform portion by 0.25% or more, and wherein a variation of Ti content rate in the inner region of the substrate excluding the first region and the non-uniform portion is 0.06 mass % or less.

10. The reflective mask blank according to claim 9, wherein the substrate has a second region on the other main surface side, wherein the second region is a region within a 132 mm×104 mm square comprising a center portion in the other main surface and which is a region extending from the other main surface toward the one main surface up to a position of 500 µm in depth, and wherein the second region has the non-uniform portion therein.

11. The reflective mask blank according to claim 9, wherein Ti content rate of the substrate excluding the non-uniform portion is 3 mass % or more.

12. The reflective mask blank according to claim 9, wherein Ti/Si of the non-uniform portion is less than Ti/Si of the inner region excluding the non-uniform portion.

13. A reflective mask comprising a substrate having two opposing main surfaces, a multilayer reflective film provided on one main surface of the substrate, and a thin film provided on the multilayer reflective film and having a transfer pattern, wherein the substrate consists of a glass material containing $SiO_2$ and $TiO_2$, wherein the substrate has a first region on the one main surface side, wherein the first region is a region within a 132 mm×104 mm square comprising a center portion in the one main surface and which is a region extending from the one main surface toward the other main surface up to a position of 500 µm in depth, wherein an inner region of the substrate excluding the first region has a locally non-uniform portion, wherein a ratio of Ti content rate to Si content rate (Ti/Si) of the non-uniform portion differs from Ti/Si of the inner region excluding the non-uniform portion by 0.25% or more, and wherein a variation of Ti content rate in the inner region of the substrate excluding the first region and the non-uniform portion is 0.06 mass % or less.

14. The reflective mask according to claim 13, wherein the substrate has a second region on the other main surface side,
   wherein the second region is a region within a 132 mm×104 mm square comprising a center portion in the other main surface and which is a region extending from the other main surface toward the one main surface up to a position of 500 μm in depth, and
   wherein the second region has the non-uniform portion therein.

15. The reflective mask according to claim 13, wherein Ti content rate of the substrate excluding the non-uniform portion is 3 mass % or more.

16. The reflective mask according to claim 13, wherein Ti/Si of the non-uniform portion is less than Ti/Si of the inner region excluding the non-uniform portion.

17. A method of manufacturing a semiconductor device comprising transferring the transfer pattern to a resist film on a semiconductor substrate by exposure using the reflective mask according to claim 13.

\* \* \* \* \*